US012278265B2

(12) United States Patent
Liu et al.

(10) Patent No.: US 12,278,265 B2
(45) Date of Patent: Apr. 15, 2025

(54) METHOD FOR FABRICATING A FIN WITH MINIMAL LENGTH BETWEEN TWO SINGLE-DIFFUSION BREAK (SDB) TRENCHES

(71) Applicant: UNITED MICROELECTRONICS CORP., Hsin-Chu (TW)

(72) Inventors: Chien-Heng Liu, Pingtung County (TW); Chia-Wei Huang, Kaohsiung (TW); Hsin-Jen Yu, Tainan (TW); Yung-Feng Cheng, Kaohsiung (TW); Ming-Jui Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/206,617

(22) Filed: Jun. 7, 2023

(65) Prior Publication Data
US 2023/0317778 A1 Oct. 5, 2023

Related U.S. Application Data

(62) Division of application No. 17/118,630, filed on Dec. 11, 2020, now Pat. No. 11,715,759.

(30) Foreign Application Priority Data

Nov. 16, 2020 (CN) .......................... 202011276918.0

(51) Int. Cl.
*H01L 29/66* (2006.01)
*H01L 21/762* (2006.01)
(Continued)

(52) U.S. Cl.
CPC .... *H01L 29/0649* (2013.01); *H01L 21/76224* (2013.01); *H01L 29/66795* (2013.01); *H01L 29/785* (2013.01); *H01L 29/7851* (2013.01)

(58) Field of Classification Search
CPC ..... H01L 21/823431; H01L 21/823821; H01L 21/845; H01L 27/0886; H01L 27/0924; H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439;
(Continued)

(56) References Cited

U.S. PATENT DOCUMENTS 9,368,496 B1 6/2016 Yu
9,524,911 B1 12/2016 Tsai
(Continued)

OTHER PUBLICATIONS

Wei, the specification, including the claims, and drawings in the U.S. Appl. No. 15/480,340 , filed Apr. 5, 2017.

*Primary Examiner* — Younes Boulghassoul
(74) *Attorney, Agent, or Firm* — Winston Hsu

(57) ABSTRACT

A method for fabricating minimal fin length includes the steps of first forming a fin-shaped structure extending along a first direction on a substrate, forming a first single-diffusion break (SDB) trench and a second SDB trench extending along a second direction to divide the fin-shaped structure into a first portion, a second portion, and a third portion, and then performing a fin-cut process to remove the first portion and the third portion.

10 Claims, 10 Drawing Sheets

(51) Int. Cl.
*H01L 29/06* (2006.01)
*H01L 29/78* (2006.01)

(58) Field of Classification Search
CPC ............... H01L 29/775; H01L 29/0649; H01L 29/0653; H01L 29/6681; H01L 21/823481; H01L 21/823878; H01L 21/76224; H01L 21/76229; H01L 21/76232; H10B 12/36; H10B 12/056
See application file for complete search history.

(56) References Cited

U.S. PATENT DOCUMENTS

| | | | |
|---|---|---|---|
| 9,653,583 B1* | 5/2017 | Zhao | H01L 29/66545 |
| 10,103,265 B1* | 10/2018 | Lee | H01L 27/092 |
| 10,256,155 B1* | 4/2019 | Lin | H01L 21/823481 |
| 10,269,654 B1 | 4/2019 | Gao | |
| 10,622,479 B1* | 4/2020 | Yang | H01L 27/0924 |
| 10,825,741 B2 | 11/2020 | Zang | |
| 10,867,999 B2 | 12/2020 | Wang | |
| 10,950,506 B2 | 3/2021 | Xie | |
| 2016/0086841 A1* | 3/2016 | Song | H01L 29/165 438/424 |
| 2016/0099181 A1* | 4/2016 | Tung | H01L 27/092 257/369 |
| 2017/0062475 A1 | 3/2017 | Song | |
| 2017/0243790 A1* | 8/2017 | Xie | H01L 21/823437 |
| 2018/0204762 A1* | 7/2018 | Min | H01L 21/823821 |
| 2019/0006360 A1* | 1/2019 | Tung | H01L 27/0922 |
| 2019/0027602 A1 | 1/2019 | Lee | |
| 2019/0131139 A1* | 5/2019 | Oh | G06F 30/392 |
| 2020/0006153 A1* | 1/2020 | Lee | H01L 21/823431 |
| 2020/0058652 A1* | 2/2020 | Park | H01L 21/823821 |
| 2020/0126978 A1 | 4/2020 | Wang | |
| 2020/0161190 A1* | 5/2020 | Zang | H01L 27/0924 |
| 2020/0243643 A1* | 7/2020 | Yu | H01L 21/823431 |
| 2020/0373196 A1* | 11/2020 | Li | H01L 21/76224 |
| 2020/0381307 A1 | 12/2020 | Xie | |
| 2021/0391323 A1* | 12/2021 | Shen | H01L 21/823437 |

* cited by examiner

METHOD FOR FABRICATING A FIN WITH MINIMAL LENGTH BETWEEN TWO SINGLE-DIFFUSION BREAK (SDB) TRENCHES

CROSS REFERENCE TO RELATED APPLICATIONS

This application is a division of U.S. application Ser. No. 17/118,630, filed on Dec. 11, 2020. The content of the application is incorporated herein by reference.

BACKGROUND OF THE INVENTION

1. Field of the Invention

The invention relates to a method for fabricating semiconductor device, and more particularly to a method of using single diffusion break (SDB) structure to enlarge photolithography window.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems such as window limitation in lithography process. Hence how to improve the current FinFET fabrication to resolve this issue has become an important task in this field.

SUMMARY OF THE INVENTION

According to an embodiment of the present invention, a method for fabricating minimal fin length includes the steps of first forming a fin-shaped structure extending along a first direction on a substrate, forming a first single-diffusion break (SDB) trench and a second SDB trench extending along a second direction to divide the fin-shaped structure into a first portion, a second portion, and a third portion, and then performing a fin-cut process to remove the first portion and the third portion.

According to another aspect of the present invention, a semiconductor device includes a fin-shaped structure extending along a first direction on a substrate, a first single diffusion break (SDB) structure extending along a second direction on one side of the fin-shaped structure, and a second SDB structure extending along the second direction on another side of the fin-shaped structure. Preferably, the first SDB structure includes a first side contacting the fin-shaped structure and a second side not contacting any fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
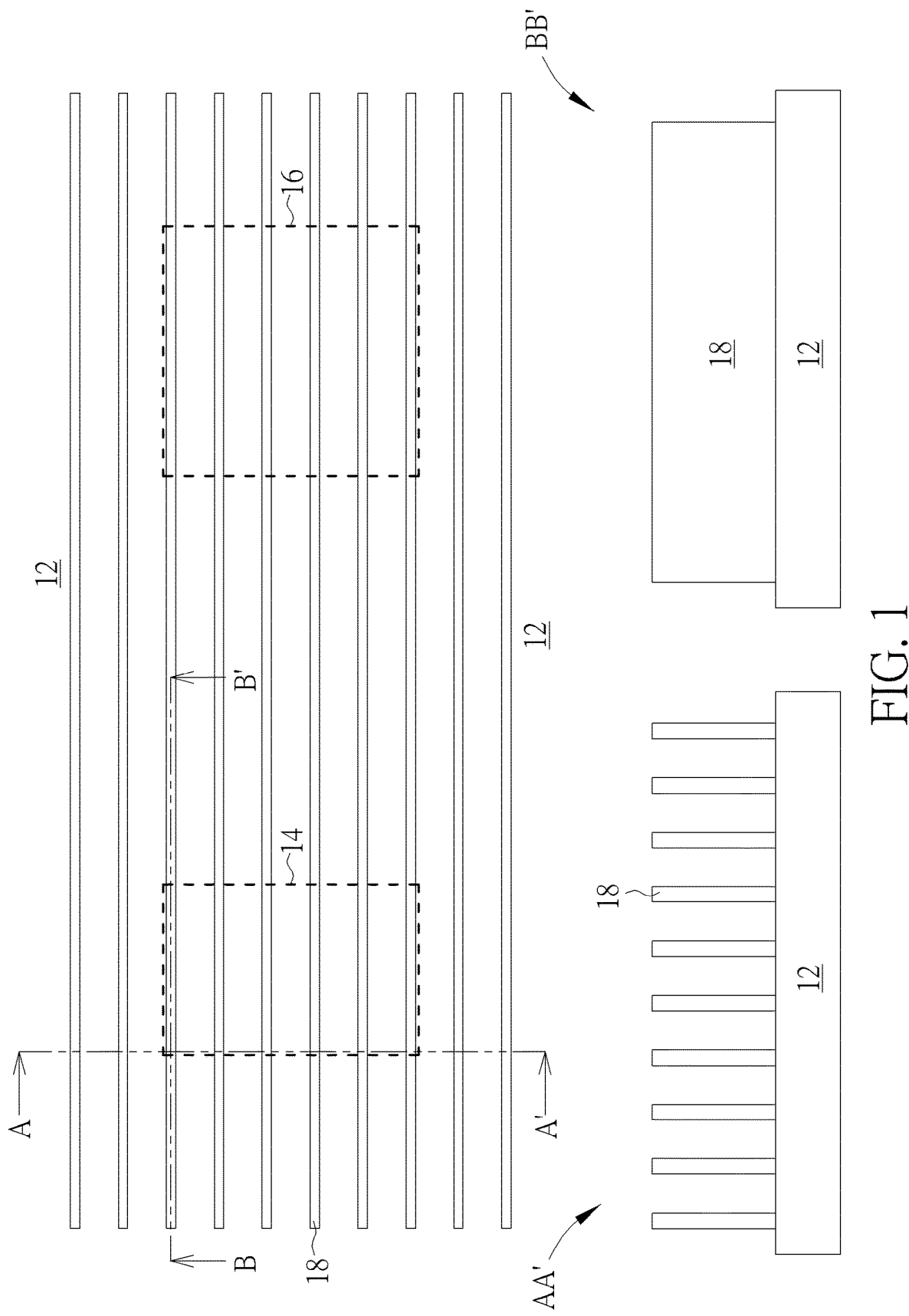
FIGS. 1-6 illustrate a method for fabricating a semiconductor device according to an embodiment of the present invention.

Referring to FIGS. 1-6, FIGS. 1-6 illustrate a method for fabricating a semiconductor device according to an embodiment of the present invention, in which the bottom left portions of FIGS. 1-6 illustrate cross-sectional views of the top portions of FIGS. 1-6 for fabricating the semiconductor device along the sectional line AA' and bottom right portions of FIGS. 1-6 illustrate cross-sectional views of the top portions of FIGS. 1-6 for fabricating the semiconductor device along the sectional line BB'. As shown in FIG. 1, a substrate 12, such as a silicon substrate or silicon-on-insulator (SOI) substrate is first provided. Next, a dummy region 14 and an active region 16 are defined on the substrate 12, and a plurality of fin-shaped structures 18 are formed on the substrate 12 and extending from the dummy region 14 to the active region 16. Preferably, at least a dummy fin-shaped structure having minimal fin length and dummy gate structures standing astride the dummy fin-shaped structure will be formed on the dummy region 14 in the later process whereas fin-shaped structures with normal fin length and active gate structures standing astride the fin-shaped structures will be formed on the active region 16 afterwards. It should be noted that even though ten fin-shaped structures 18 are disposed on the substrate 12 in this embodiment, it would also be desirable to adjust the number of fin-shaped structures 18 depending on the demand of the product, which is also within the scope of the present invention.

Preferably, the fin-shaped structures 18 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 could also be obtained by first forming a patterned mask (not shown) on the substrate, 12, and through an etching process, the pattern of the patterned mask is transferred to the substrate 12 to form the fin-shaped structures 18. Moreover, the formation of the fin-shaped structures 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18. These approaches for forming fin-shaped structure are all within the scope of the present invention.

Figure 2:
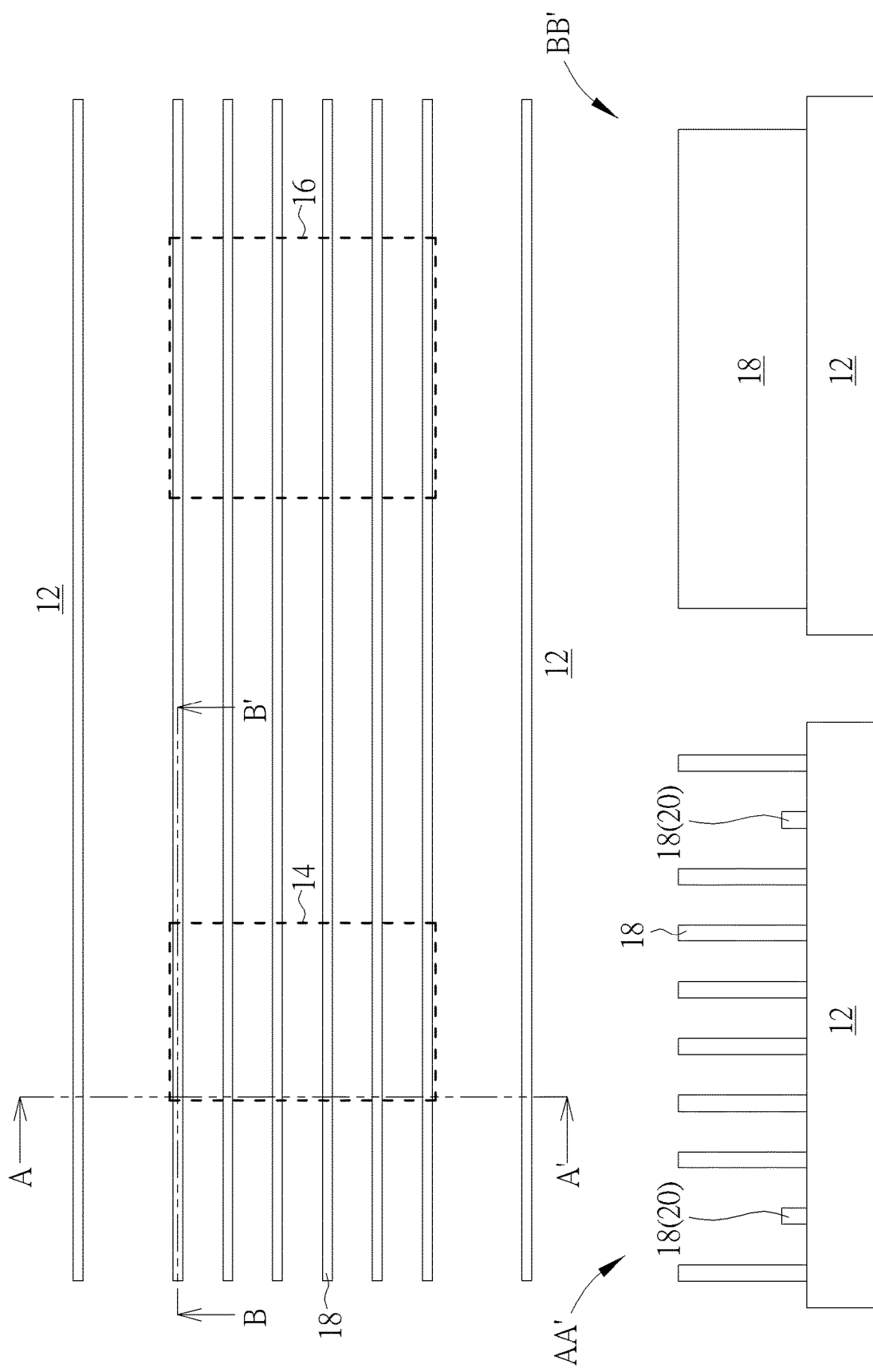

Next, as shown in FIG. 2, a photo-etching process or fin remove process is conducted to selectively remove part of the fin-shaped structures 18 outside the dummy region 14 and active region 16, such as the fin-shaped structures 18 immediately adjacent to the top edge and bottom edge of the dummy region 14 as shown in the top portion of FIG. 2. As shown in the bottom left portion of FIG. 2, after removing part of the fin-shaped structures 18 above and below top edge and bottom edge of the dummy region 14 the remaining fin-shaped structures 18 preferably form bumps 20 on the substrate 12, in which the height of the bumps 20 could lower than half or even one third of the total height of the original fin-shaped structures 18 adjacent to two sides of the bumps 20, which are all within the scope of the present invention.

Figure 3:
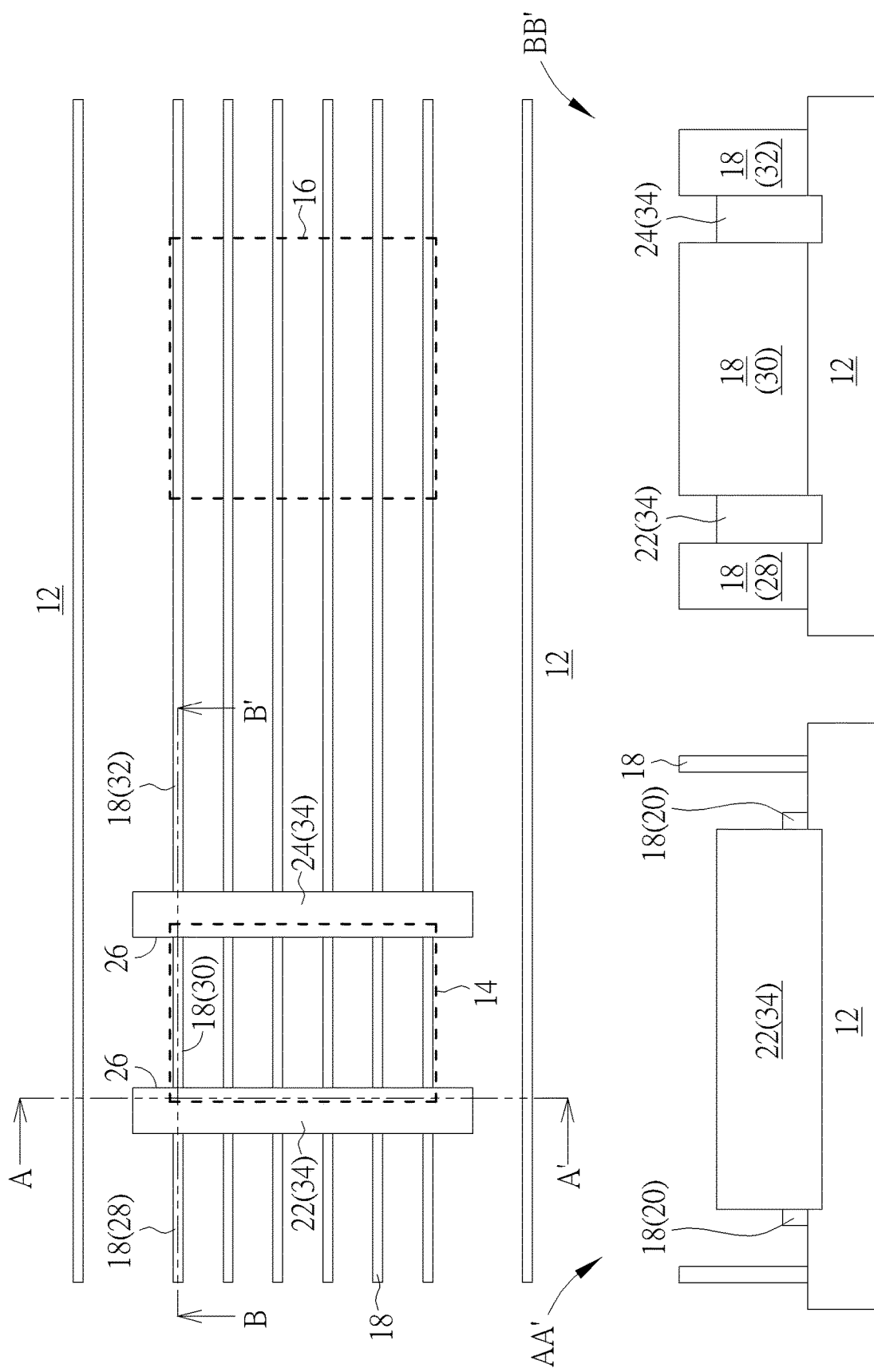

Next, as shown in FIG. 3, a single diffusion break (SDB) structure such as a first SDB structure 22 and a second SDB structure 24 are formed adjacent to two sides of the dummy region 14 crossing the fin-shaped structures 18. In this embodiment, the formation of the first SDB structure 22 and second SDB structure 24 could be accomplished by first forming a patterned mask (not shown) on the substrate 12, and then conducting an etching process by using the patterned mask as mask to remove part of the fin-shaped structure 18 adjacent to two sides of the dummy region 14 along a vertical direction (or Y-direction) to form trenches 26 or SDB trenches and at the same time divide the fin-shaped structures 18 into three portions. Specifically, the trenches 26 formed adjacent to two sides of the dummy region 14 divide each of the fin-shaped structures 18 into three portions, including a first portion 28 on left side of the first SDB structure 22, a third portion 32 on right side of the second SDB structure 24, and a second portion 30 between the first SDB structure 22 and the second SDB structure 24, in which the trenches 26 are formed to defined the position of the SDB structures formed afterwards.

Next, a dielectric layer 34 is formed to fill each of the trenches 26 completely, a planarizing process such as an etching back process or chemical mechanical polishing (CMP) process is conducted to remove part of the dielectric layer 34, and a photo-etching process is conducted to remove part of the dielectric layer 34 outside the trenches 26 so that the top surface of the remaining dielectric layer 34 is slightly lower than the top surface of the fin-shaped structures 18 for forming a first SDB structure 22 and a second SDB structure 24. In this embodiment, each of the fin-shaped structures 18 is disposed extending along a first direction (such as X-direction) while the first SDB structure 22 and second SDB structure 24 adjacent to two sides of the dummy region 14 are disposed extending along a second direction (such as Y-direction) orthogonal to the first direction.

Figure 4:
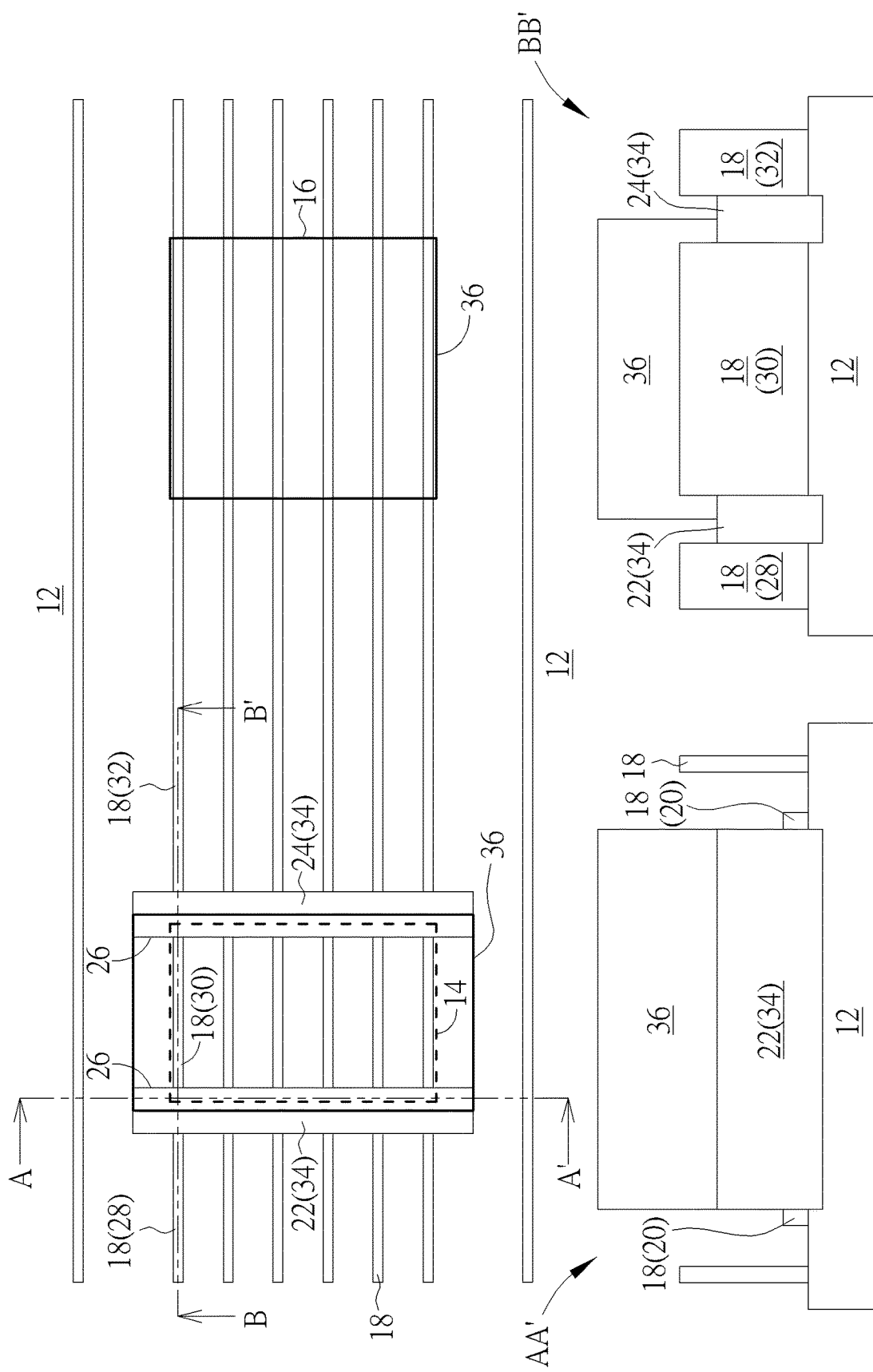

Next, as shown in FIG. 4, a fin cut process is conducted to remove the first portions 28 and third portions 32 of the aforementioned fin-shaped structures 18. In this embodiment, the fin cut process could be accomplished by first forming a patterned mask 36 such as a patterned resist on the substrate 12, in which the patterned mask 36 preferably covers part of the first SDB structure 22, the second portion 30 on the dummy region 14, part of the second SDB structure 24, and the active region 16 adjacent to the dummy region 14 while other regions not covered by the patterned mask 36 are exposed.

Figure 5:
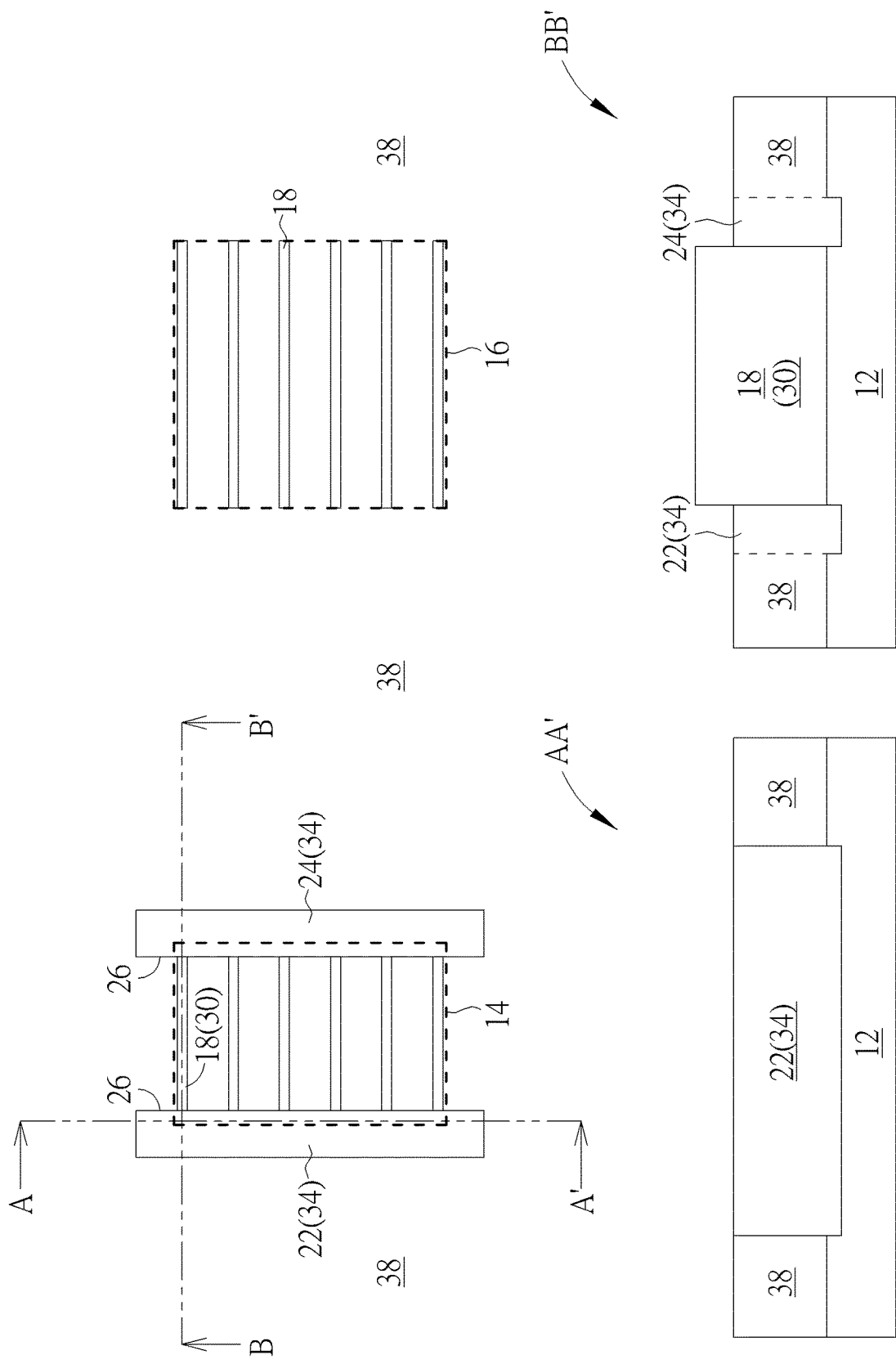

Next, as shown in FIG. 5, an etching process is conducted by using the patterned mask 36 as mask to remove all of the fin-shaped structures 18 outside the first SDB structure 22, the second portions 30, the second SDB structure 24, and the active region 16 such as the first portions 28 and the third portions 32. After removing the patterned mask 36, a shallow trench isolation (STI) 38 is formed around the dummy region 14 and the active region 16. In this embodiment, each of the SDB structures and the STI 38 are formed at different stages while the two elements such as the SDB structures and the STI 38 could be made of same material or different materials depending on the demand of the product. For instance, the first SDB structure 22 and the second SDB structure 24 are preferably made of silicon nitride (SiN) whereas the STI 38 is made of silicon oxide in this embodiment, but not limited thereto.

Figure 6:
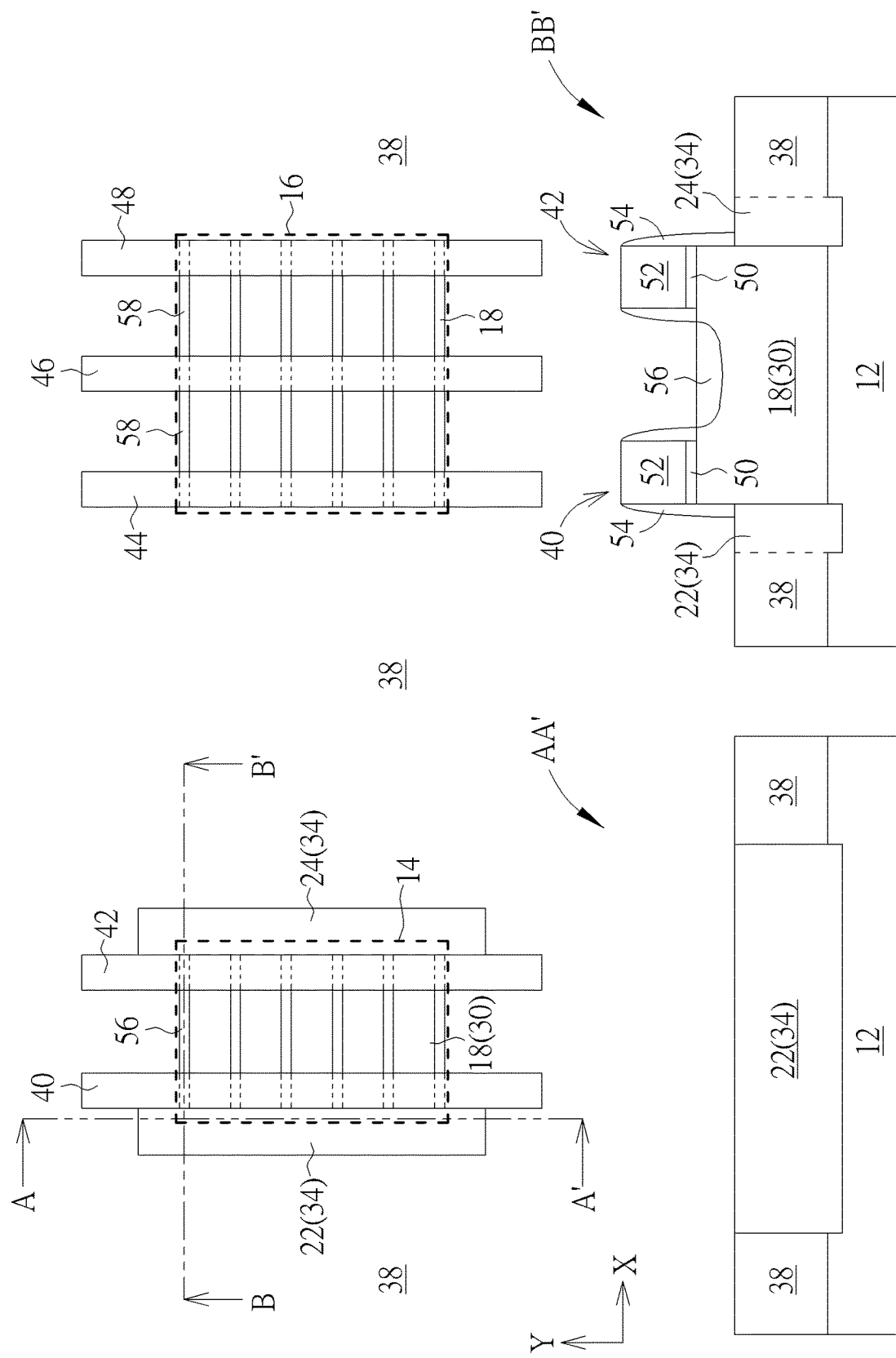

Next, as shown in FIG. 6, gate structures 40, 42, 44, 46, 48 are formed on the fin-shaped structures 18 on the dummy region 14 and active region 16. In this embodiment, the formation of the gate structures 40, 42, 44, 46, 48 could be accomplished by a gate first process, a high-k first approach from gate last process, or a high-k last approach from gate last process. Since this embodiment pertains to a high-k last approach, a gate dielectric layer 50 or interfacial layer, a gate material layer 52 made of polysilicon, and at least a selective hard mask (not shown) could be formed sequentially on the substrate 12, and a photo-etching process is then conducted by using a patterned resist (not shown) as mask to remove part of the gate material layer 52 and part of the gate dielectric layer 50 through single or multiple etching processes. After stripping the patterned resist, gate structures 40, 42, 44, 46, 48 each composed of a patterned gate dielectric layer 50 and a patterned gate material layer 52 are formed on the substrate 12.

Next, at least a spacer 54 is formed on the sidewalls of the each of the gate structures 40, 42, 44, 46, 48 and a doped region 56 and/or source/drain regions 58 could be formed in the fin-shaped structures 18 adjacent to two sides of the spacers 54. For instance, a doped region 56 could be formed between the gate structures 40, 42 on the dummy region 14 while source/drain regions 58 could be formed adjacent to two sides of the gate structures 46 on the active region 16. In this embodiment, each of the spacers 54 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 58 could include n-type dopants or p-type dopants depending on the type of device being fabricated. Moreover, the source/drain regions 58 could also include different epitaxial materials depending on the type of transistor being fabricated. For instance, the source/drain regions 58 on NMOS region could include silicon carbide (SiC) or silicon phosphide (SiP) whereas source/drain regions 58 on PMOS region could include silicon germanium (SiGe).

Next, an interlayer dielectric (ILD) layer (not shown) could be formed on the gate structures 40, 42, 44, 46, 48 and a replacement metal gate (RMG) process could be conducted to transform the gate structures 40, 42, 44, 46, 48 into metal gates. Since the transformation of gate structures 40, 42, 44, 46, 48 into metal gates are well known to those skilled in the art, the details of which are not explained herein for the sake of brevity. It should be noted that the second portion 30 of the fin-shaped structures on the dummy region 14 formed through the aforementioned process are in fact fin-shaped structures having minimal lengths so that gate structures 40, 42 could only be formed immediately adjacent to front end and back end of the second portions 30 to form dummy gates due to insufficient length of the fin-shaped structures whereas operational gate structure 46 with source/drain regions 58 adjacent to two sides of the gate structure 46 could be formed on fin-shaped structures 18 having sufficient length for forming operations transistors.

Referring to FIG. 6, FIG. 6 further illustrates a structural view of a semiconductor device according to an embodiment of the present invention. As shown in FIG. 6, the semiconductor device includes a dummy region 14 and an active region 16 defined on the substrate 12, a plurality of fin-shaped structures 18 extending along a first direction such as X-direction on the dummy region 14 and active region 16, a first SDB structure 22 extending along a second direction such as Y-direction on one side such as left side of the fin-shaped structures 18 on the dummy region 14, a second SDB structure 24 extending along the same second direction on another side such as right side of the fin-shaped structures 18 on the dummy region 14, a gate structure 40 extending along the Y-direction and overlapping one side such as left side of the fin-shaped structures 18 on the dummy region 14, a gate structure 42 extending along the Y-direction and overlapping another side such as right side of the fin-shaped structures 18 on the dummy region 14, a gate structure 44 extending along the Y-direction on one side such as left side of the fin-shaped structures 18 on the active region 16, a gate structure 48 extending along the Y-direction on another side such as right side of the fin-shaped structures 18 on the active region 16, and a gate structure 46 extending along the Y-direction between the gate structures 44, 48 on the active region 16.

Viewing from a more detailed perspective, an edge such as left edge or left sidewall of the gate structure 40 is aligned with left edge of the fin-shaped structures 18 on the dummy region 14, an edge such as right edge or right sidewall of the gate structure 42 is aligned with right edge of the fin-shaped structures 18 on the dummy region 14, the first SDB structure 22 includes a first side such as right side directly contacting the fin-shaped structure 18 and a second side such as left side not contacting any of the fin-shaped structures directly. Similarly, the second SDB structure 24 includes a third side such as left side directly contacting the fin-shaped structures 18 and a fourth side such as right side not contacting any of the fin-shaped structures directly.

As illustrate by the cross-section view shown in bottom right corner of FIG. 6, the bottom surface of the first SDB structure 22 on left side of the dummy region 14 and the bottom surface of the second SDB structure 24 on right side of the dummy region 14 are slightly lower than the top surface of the substrate 12 or viewing from another angle, the top surface of the substrate 12 directly under the first SDB structure 22 is slightly lower than the top surface of the substrate 12 directly under the fin-shaped structures 18 on the dummy region 14. Similarly, the top surface of the substrate 12 directly under the second SDB structure 24 is slightly lower than the top surface of the substrate 12 directly under the fin-shaped structures 18 on the dummy region 14.

Figure 7:
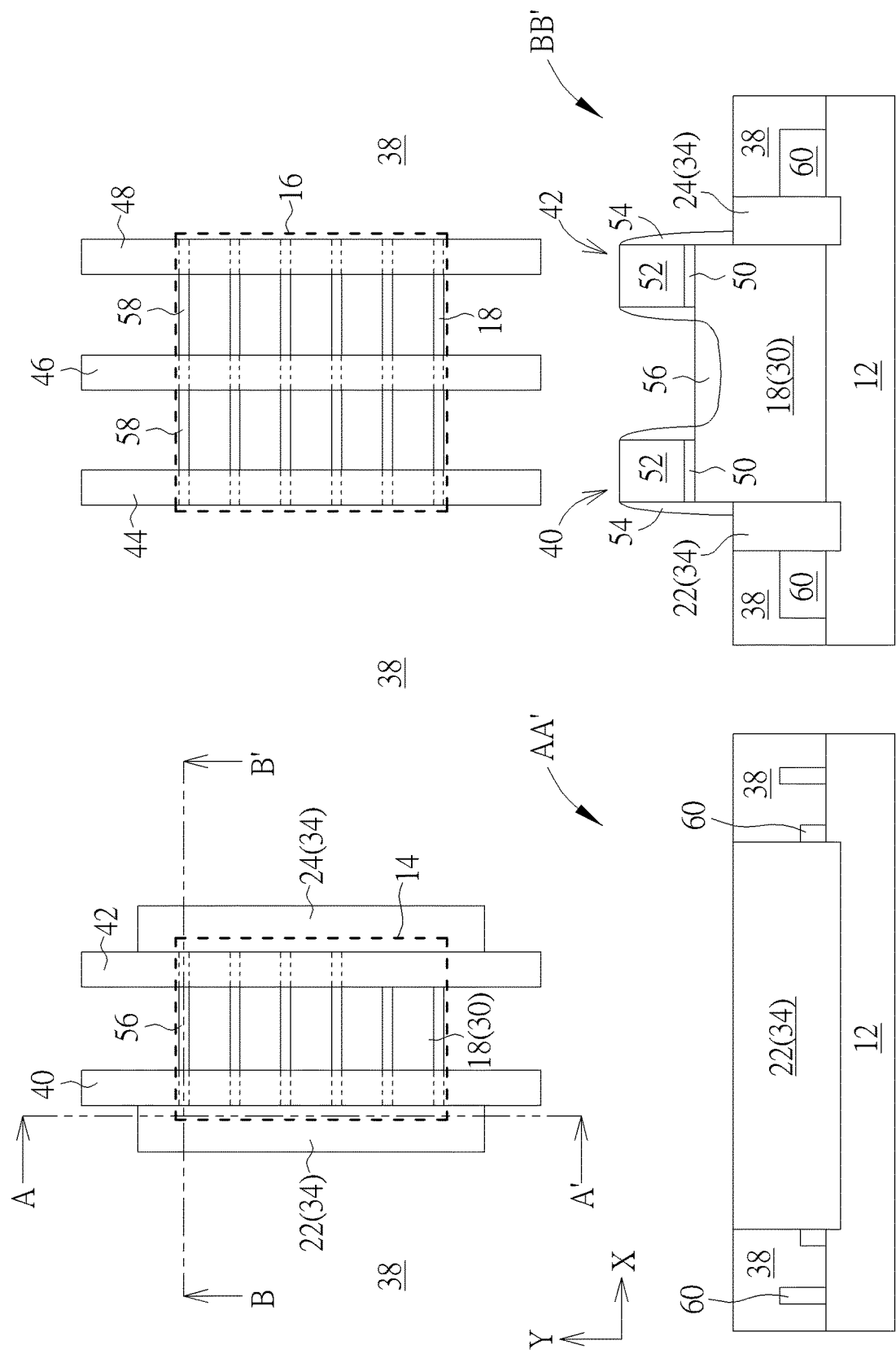
FIG. 7 illustrates a structural view of a semiconductor device according to an embodiment of the present invention.

Referring to FIG. 7, FIG. 7 further illustrates a structural view of a semiconductor device according to an embodiment of the present invention. As shown in bottom right corner of FIG. 7, in contrast to the aforementioned embodiment of using fin cut process to completely remove the first portions 28 and third portions 32 so that the left side of the first SDB structure 22 not contacting any of the fin-shaped structures directly and the right side of the second SDB structure 24 not contacting any of the fin-shaped structures directly, according to other embodiment of the present invention it would also be desirable to conduct the fin cut process and remain part of the fin-shaped structures 18 to form bumps 60 during removal of the first portions 28 and third portions 32 so that right side of the first SDB structure 22 would contact the fin-shaped structures 18 while left side of the first SDB structure 22 would contact the bump 60 directly and left side of the second SDB structure 24 would contact the fin-shaped structures 18 while right side of the second SDB structure 24 would contact the bump 60 directly, which is also within the scope of the present invention.

Figure 8:
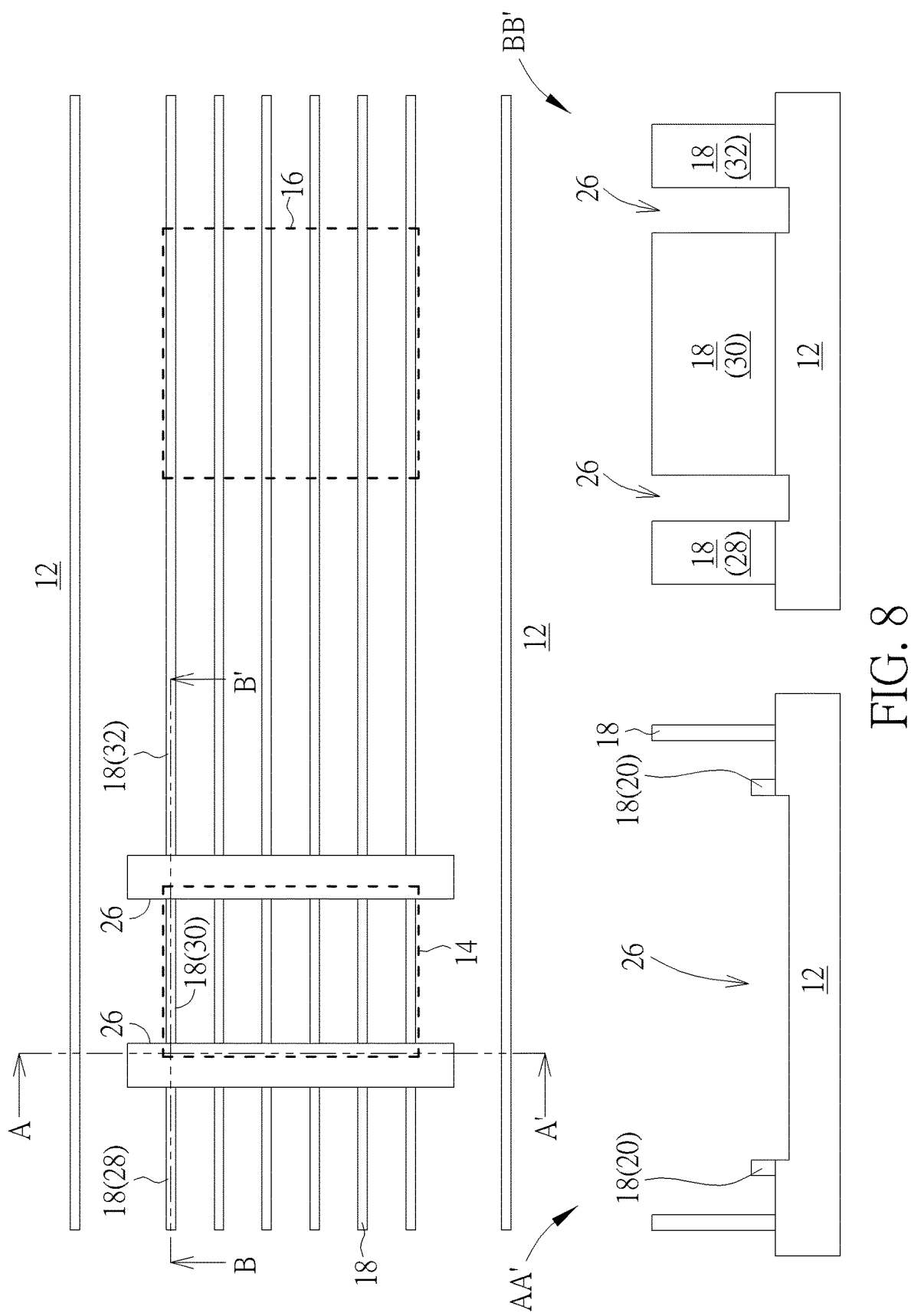
FIGS. 8-10 illustrate a method for fabricating a semiconductor device according to an embodiment of the present invention.
Figure 9:
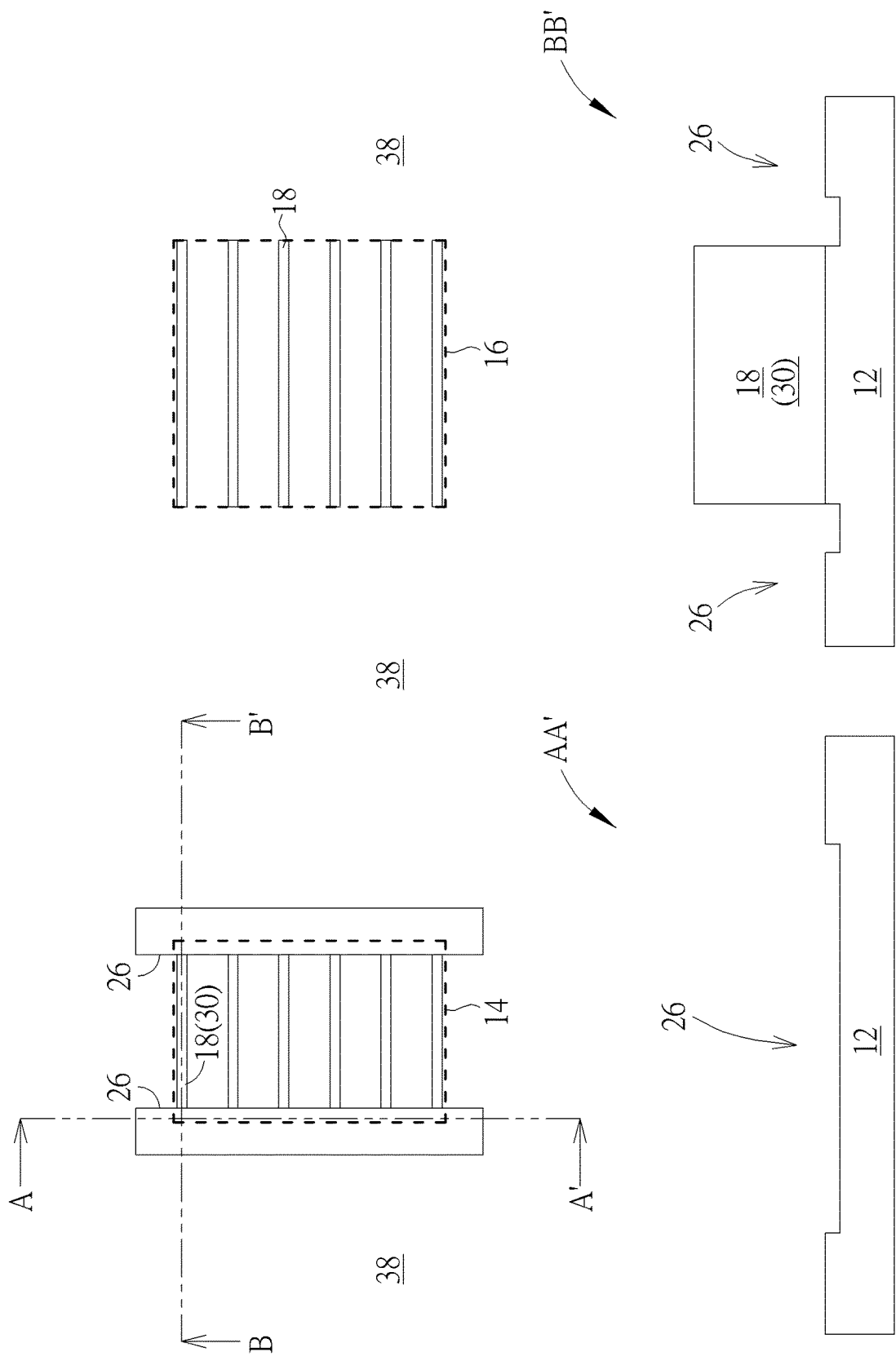
Figure 10:
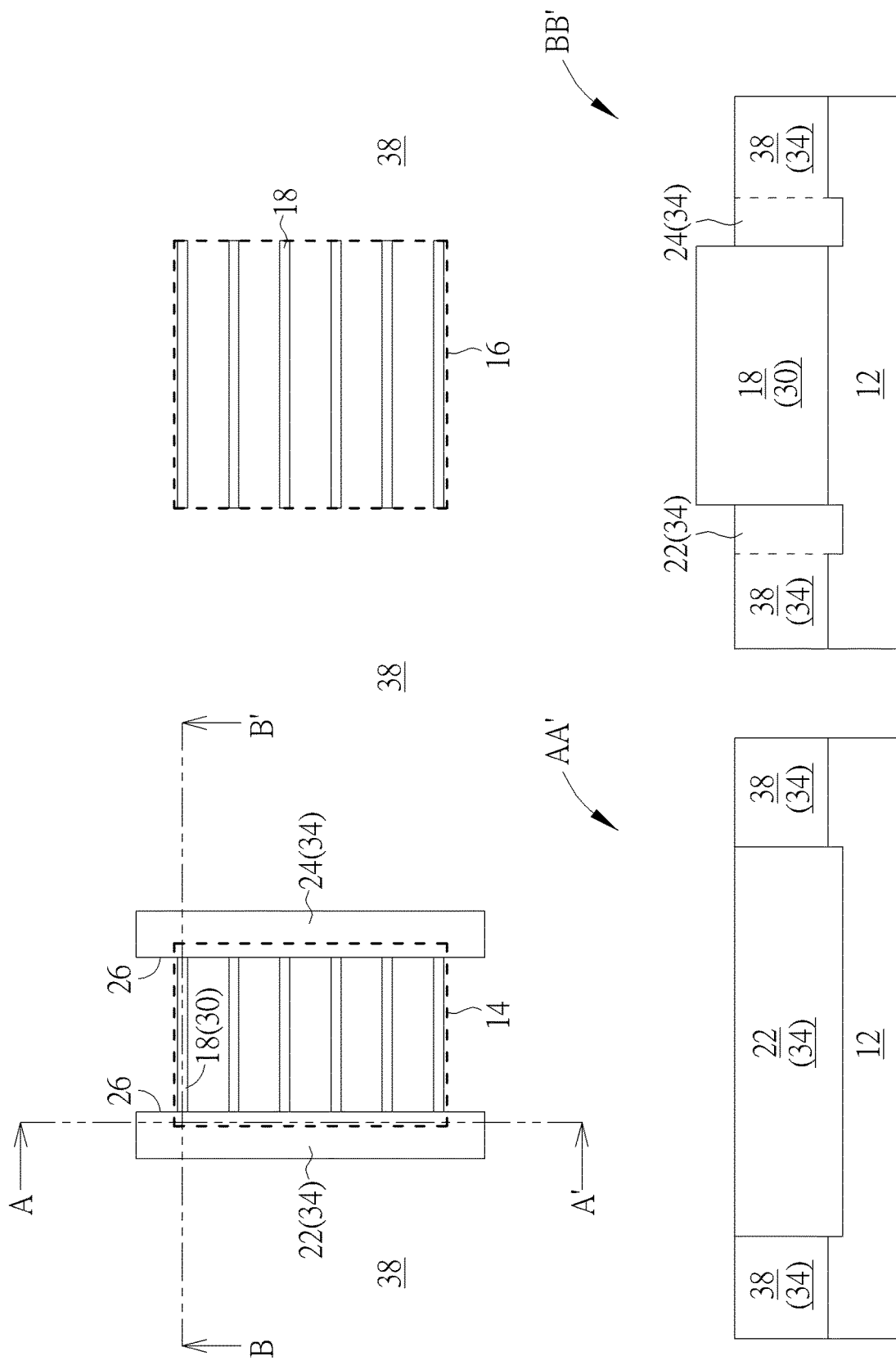

Referring to FIGS. 8-10, FIGS. 8-10 illustrate a method for fabricating a semiconductor device according to an embodiment of the present invention. As shown in FIG. 8, instead of forming trenches 26 adjacent to two sides of the dummy region 14, forming a dielectric layer 34 in the trenches 26 to form the first SDB structure 22 and second SDB structure 24, and then conducting a fin cut process as conducted in FIGS. 3-5, it would also be desirable to conduct an etching process by using a patterned mask (not shown) to remove part of the fin-shaped structures 18 adjacent to two sides of the dummy region 14 along the extending direction of the fin-shaped structures 18 for forming trenches 26 and at the same time divide the fin-shaped structures 18 into three portions, in which the trenches 26 could also be referred to as SDB trenches.

Next, as shown in FIG. 9, the aforementioned fin cut process conducted in FIGS. 4-5 could be carried out after the trenches 26 are formed by using the patterned mask 36 to remove the first portions 28 and third portions 32 of the fin-shaped structures 18 outside the dummy region 14 and active region 16, and the patterned mask 36 is removed thereafter.

Next, as shown in FIG. 10, a dielectric layer 34 is formed to fill the trenches 26 and area outside the trenches 26 completely, and an etching back process is conducted to remove part of the dielectric layer 34 to form a first SDB structure 22 and second SDB structure 24 in the trenches 26 and at the same time form a STI 38 adjacent to the first SDB structure 22 and second SDB structure 24. Since the first SDB structure 22, the second SDB structure 24, and the STI 38 are formed at the same time at this stage, the three elements 22, 24, 38 are preferably made of same material such as silicon oxide. Next, the process conducted in FIG. 6 could be carried out to form gate structures on the fin-shaped structures 18 on the dummy region 14 and active region 16, and the details of which are not explained herein for the sake of brevity.

Overall, the present invention discloses an approach for fabricating fin-shaped structures having minimal length, in which a first SDB structure and a second SDB structure are first formed on the dummy region 14 to divide fin-shaped structures into three portions, a patterned mask is formed on the first SDB structure, the second SDB structure, and a second portion of fin-shaped structures between the two SDB structures, and then a fin cut process is conducted to remove the first portion and third portion of the fin-shaped structures adjacent to two sides of the SDB structures. In contrast to the conventional approach of using patterned to conduct fin cut process and unable to accurately focus and remove fin-shaped structures outside the dummy region and active region due to limitation of lithography process, the present invention preferably uses two SDB structures for expanding the window of photolithography process thereby obtaining better focus and alignment. Moreover, the second portions 30 of fin-shaped structures formed on the dummy region 14 through aforementioned process are in fact fin-shaped structures having minimal length such that it would only be possible to form two dummy gate structures 40, 42 on front and back end of the fin-shaped structures respectively while an operational gate structure 46 with accompanying source/drain regions 58 on two sides could be formed on fin-shaped structures having standard or regular length on the active region 16.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating minimal fin length, comprising:
    forming a fin-shaped structure extending along a first direction on a substrate;
    forming a first single-diffusion break (SDB) trench and a second SDB trench extending along a second direction to divide the fin-shaped structure into a first portion, a second portion, and a third portion; and
    performing a fin-cut process to remove the first portion and the third portion.

2. The method of claim 1, wherein the first portion is on one side of the first SDB trench and the third portion on one side of the second SDB trench.

3. The method of claim 1, wherein the second portion is between the first SDB trench and the second SDB trench.

4. The method of claim 1, further comprising forming a dielectric layer in the first SDB trench and the second SDB trench to form a first SDB structure and a second SDB structure.

5. The method of claim 4, wherein the second portion contacts the first SDB structure and the second SDB structure directly.

6. The method of claim 1, wherein the fin-cut process comprises:
    forming a patterned mask on the first SDB trench, the second portion, and the second SDB trench; and
    removing the first portion and the third portion.

7. The method of claim 1, further comprising:
    forming a first gate structure extending along the second direction on one side of the second portion; and
    forming a second gate structure extending along the second direction on another side of the second portion.

8. The method of claim 7, wherein an edge of the first gate structure is aligned with an edge of the second portion.

9. The method of claim 7, wherein an edge of the second gate structure is aligned with an edge of the second portion.

10. The method of claim 1, wherein the first direction is orthogonal to the second direction.

* * * * *